(12) United States Patent
Ishikawa et al.

(10) Patent No.: US 10,696,544 B2
(45) Date of Patent: Jun. 30, 2020

(54) SYNTHETIC RESIN MOLDED ARTICLE AND METHOD FOR PRODUCING THE SAME

(71) Applicant: DENSO CORPORATION, Kariya, Aichi-pref. (JP)

(72) Inventors: Motomi Ishikawa, Kariya (JP); Norihito Yoshida, Kariya (JP); Ryosuke Izumi, Kariya (JP); Hiroyuki Yamakawa, Kariya (JP); Hodaka Mori, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/097,697

(22) PCT Filed: May 11, 2017

(86) PCT No.: PCT/JP2017/017872
§ 371 (c)(1),
(2) Date: Oct. 30, 2018

(87) PCT Pub. No.: WO2017/212860
PCT Pub. Date: Dec. 14, 2017

(65) Prior Publication Data
US 2019/0161339 A1    May 30, 2019

(30) Foreign Application Priority Data
Jun. 9, 2016    (JP) .................. 2016-115433

(51) Int. Cl.
*B81B 7/00* (2006.01)
*H01L 23/31* (2006.01)
(Continued)

(52) U.S. Cl.
CPC ........ *B81B 7/0048* (2013.01); *B29C 45/1671* (2013.01); *H01L 21/56* (2013.01);
(Continued)

(58) Field of Classification Search
CPC ........ B29C 45/14336; B29C 45/14655; B29C 45/14836; B29C 45/1671
(Continued)

(56) References Cited

U.S. PATENT DOCUMENTS

2015/0158221 A1    6/2015    Izumi et al.

FOREIGN PATENT DOCUMENTS

JP    2009-166368 A    7/2009
JP    2011-119500 A    6/2011
(Continued)

*Primary Examiner* — Long K Tran
(74) *Attorney, Agent, or Firm* — Posz Law Group, PLC

(57) ABSTRACT

A synthetic resin molded article includes an electric element part extending in a distal direction and a primary molded part. The primary molded part has an element covering portion and a body portion. The element covering portion has a distal end surface exposed in the distal direction and a first side surface extending in a proximal direction opposite to the distal direction. The element covering portion covers a proximal portion of the electric element portion, and a distal end portion of the electric element portion projects from the distal end surface in the distal direction. The body portion has an intermediate surface exposed in the distal direction and a second side surface extending in the proximal direction. The body portion is disposed on a side of the element covering portion in the distal direction and is integrally connected to the element covering portion.

5 Claims, 4 Drawing Sheets

(51) Int. Cl.
*H01L 21/56* (2006.01)
*B29C 45/16* (2006.01)
*B29C 45/14* (2006.01)
*B29K 81/00* (2006.01)
*B29L 31/34* (2006.01)

(52) U.S. Cl.
CPC ........ *H01L 23/31* (2013.01); *B29C 45/14336* (2013.01); *B29C 45/14655* (2013.01); *B29C 45/14836* (2013.01); *B29K 2081/04* (2013.01); *B29L 2031/3406* (2013.01); *B81B 2201/0264* (2013.01); *B81B 2207/015* (2013.01)

(58) Field of Classification Search
USPC ........................................................ 257/415
See application file for complete search history.

(56) References Cited

FOREIGN PATENT DOCUMENTS

| | | |
|---|---|---|
| JP | 2012-225699 A | 11/2012 |
| JP | 2013-096970 A | 5/2013 |
| JP | 5494425 B2 | 5/2014 |
| JP | 2014-106131 A | 6/2014 |
| JP | 2016-025202 A | 2/2016 |

SYNTHETIC RESIN MOLDED ARTICLE AND METHOD FOR PRODUCING THE SAME

CROSS REFERENCE TO RELATED APPLICATIONS

This application is a U.S. national phase of International Application No. PCT/JP2017/017872 filed on May 11, 2017 and is based on Japanese Patent Application No. 2016-115433 filed on Jun. 9, 2016, the disclosures of which are incorporated herein by reference.

TECHNICAL FIELD

The present disclosure relates to a synthetic resin molded article and a method for producing the same.

BACKGROUND

JP 5772846 B2 discloses an electronic device having a molded IC and a connector case. The molded IC includes a sensor chip and a molded resin. A portion on an end of the sensor chip projects outside of the molded resin, and a portion on the other end of the sensor chip is encapsulated in the molded resin. The connector case is configured to have a connector resin part, which is a secondary molded article, as a base. In the molded resin, a portion encapsulated with the connector resin part is in direct contact with the connector resin part. A portion of the molded resin adjacent to the sensor chip is exposed from the connector resin part.

SUMMARY

In a case of producing a secondary molded article that covers a part of a primary molded article with a synthetic resin by secondary molding, there are issues to be considered. For example, it is required to suppress an occurrence of defects on the primary molded article during the secondary molding as much as possible. Examples of such defects are cracks and interfacial peeling. The present disclosure is made in view of issues exemplified as described above.

According to an aspect of the present disclosure, a synthetic resin molded article includes an electric element part and a primary molded part. The electric element part is a semiconductor substrate extending in a distal direction from a proximal portion to a distal end portion. The primary molded part is a synthetic resin part partly covering the electric element part. The primary molded part includes an element covering portion and a body portion. The element covering portion has a distal end surface and a first side surface. The distal end surface exposes in the distal direction. The first side surface extends from an outer edge of the distal end surface in a proximal direction. The proximal direction is opposite to the distal direction. The element covering portion is configured to cover the proximal portion of the electric element part and to expose the distal end portion of the electric element part from the distal end surface such that the distal end portion exposes in the distal direction. The body portion has an intermediate surface and a second side surface. The intermediate surface exposes in the distal direction and extends in a direction intersecting with the proximal direction from an end of the first side surface, the end of the first side surface being adjacent to the proximal portion than the distal end portion. The second side surface extends from an outer edge of the intermediate surface in the proximal direction. The body portion is integrally connected to the element covering portion on a side of the element covering portion in the proximal direction.

In the above described configuration, a part of the electric element part (that is, a distal end portion of the electric element part) projects from the distal end surface of the element covering portion of the primary molded part in such a manner that the distal end portion exposes in the distal direction. Therefore, there may be a fear that various defects (for example, an occurrence of cracks or the like) will occur at the position where the electric element part projects in the primary molded part during a secondary molding.

In the above-described configuration, however, the primary molded part has the body portion on the side of the element covering portion in the proximal direction. The body portion has the intermediate surface exposing in the distal direction. The intermediate surface extends from the end of the first side surface in the direction intersecting with the proximal direction, the end of the first side surface being adjacent to the proximal portion. Therefore, the intermediate surface extends outwardly from the element covering portion. Namely, the body portion of the primary molded part is provided with a projection projecting outwardly in the region where the intermediate surface is provided. An occurrence of the defects at the position where the electric element part projects in the primary molded part can be suppressed as much as possible by utilizing the above-described configuration of the primary molded part, that is, by utilizing the intermediate surface as a mold contact surface during the secondary molding, for example.

According to an aspect of the present disclosure, a method for producing a synthetic resin molded article is to cover a primary molded article that has an electric element part and a primary molded part with a synthetic resin, the electric element part being a semiconductor substrate extending in a distal direction from a proximal portion to a distal end portion, the primary molded part partly covering the electric element part. Specifically, the production method includes preparing the primary molded article, setting the primary molded article to a mold for a secondary molding, and performing a secondary molding.

The primary molded article has the primary molded part that includes an element covering portion and a body portion. The element covering portion has a distal end surface and a first side surface. The first side surface extends from an outer edge of the distal end surface in a proximal direction. The proximal direction is opposite to the distal direction. The element covering portion is configured to cover the proximal portion of the electric element portion and to expose the distal end portion of the electric element portion from the distal end surface. The body portion has an intermediate surface and a second side surface. The intermediate surface exposes in the distal direction and extends in a direction intersecting with the proximal direction from an end of the first side surface, the end of the first side surface being adjacent to the proximal portion than the distal end portion. The second side surface extends from an outer edge of the intermediate surface in the proximal direction. The body portion is integrally connected to the element covering portion on a side of the element covering portion in the proximal direction.

The mold for secondary molding has an insertion hole and a molded article contact surface. The insertion hole is configured to receive the element covering portion. The molded article contact surface connects to an opening portion of the insertion hole. The primary molded article is set to the mold for secondary molding such that the intermediate surface is in contact with the molded article contact surface. In the performing of the secondary molding, a periphery of a region of the body portion further from the intermediate surface in the proximal direction is covered with the synthetic resin, inside of the mold for secondary molding.

As described above, in the primary molded article, the distal end portion of the electric element part is projected from the distal end surface of the element covering portion of the primary molded part in the distal direction. On the other hand, the proximal portion of the electric element part is covered with the primary molded part. Further, in the primary molded part, the body portion is provided on the side of the element covering portion in the proximal direction. The body portion has the intermediate surface exposing in the distal end direction. The intermediate surface extends from the end of the first side surface of the element covering portion in the direction intersecting with the proximal direction, the end being adjacent in the proximal direction.

Therefore, the intermediate surface extends outwardly from the element covering portion. Namely, the body portion of the primary molded part is provided with a projection projecting outwardly in the region where the intermediate surface is provided. Therefore, the primary molded article can be set to the mold for secondary molding in such a manner that the intermediate surface is in contact with the molded article contact surface of the mold. Therefore, an occurrence of the defects at the position where the electric element part projects in the primary molded part can be suppressed as much as possible.

DETAILED DESCRIPTION

Hereinafter, an embodiment will be described with reference to the drawings. In the embodiment and modifications subsequently described, same or equivalent parts are designated with the same reference numbers.

(Configuration of Molded Article of Embodiment)

Figure 1:
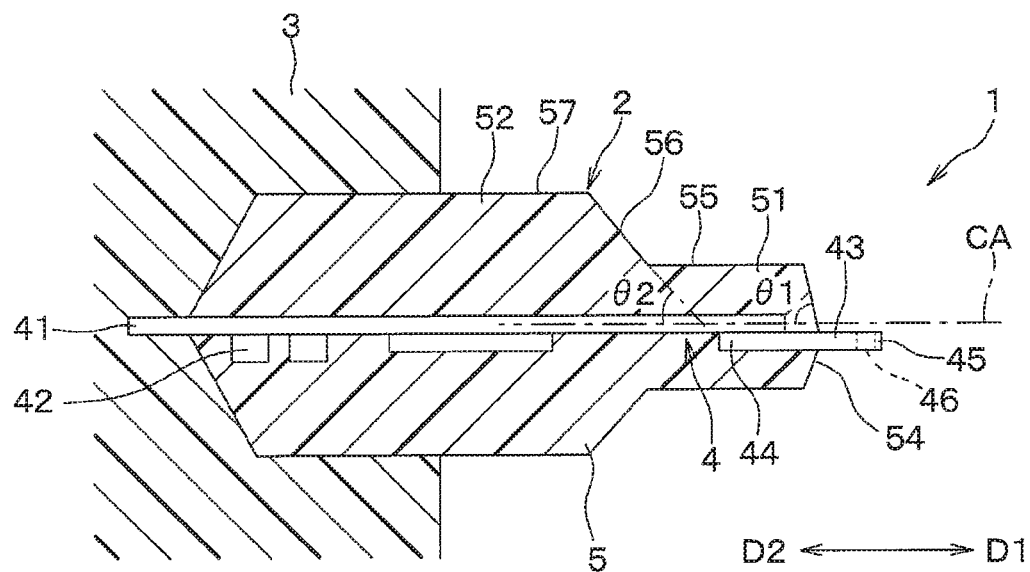
FIG. 1 is a diagram illustrating a side sectional view for showing a schematic configuration of a secondary molded article according to an embodiment.

Referring to FIG. 1, a secondary molded article 1 as an example of a synthetic resin molded article includes a primary molded article 2 and a secondary molded part 3. Namely, the secondary molded article 1 is formed by partly covering the primary molded article 2 with the secondary molded part 3. The secondary molded part 3 is formed by molding a synthetic resin, such as polyphenylene sulfide, using a mold.

Hereinafter, a rightward direction in FIG. 1 is referred to as a "distal direction", and a leftward direction in FIG. 1 is referred to as a "proximal direction". The distal direction corresponds to a direction D1 in FIG. 1, and the proximal direction corresponds to a direction D2 in FIG. 1. In regard to each of members, an end portion in the distal direction will be also referred to as a "distal end portion" and an end portion in the proximal direction will be also referred to as a "proximal portion". In the secondary molded article 1 of the present embodiment, a part of the primary molded article 2 (i.e., a proximal portion of the primary molded article) is covered with the secondary molded part 3 in such a manner that a distal end portion of the primary molded article 2 is exposed outside of the secondary molded part 3.

The primary molded article 2 includes an electric circuit part 4 and a primary molded part 5. The electric circuit part 4 is provided by a circuit board 41 on which a plurality of circuit elements 42 are mounted. A semiconductor element part 43 is mounted on the distal end portion of the circuit board 41. The semiconductor element part 43 is a semiconductor substrate that extends in the distal direction from the proximal portion 44 toward the distal end portion 45. Namely, the proximal portion 44 of the semiconductor element part 43 is fixed to the circuit board 41 through a lead frame or the like, which is not shown. The distal end portion 45 of the semiconductor element part 43 projects outside of the circuit board 41.

The semiconductor element part 43, which is an electric element part, has a sensing portion 46 at the distal end portion 45. In the present embodiment, the sensing portion 46 is configured to produce an electric output (for example, electric charges) in accordance with surrounding fluid pressure. Examples of the fluid pressure are fuel pressure, brake oil pressure, and hydrogen gas pressure. In other words, the electric circuit part 4 and the semiconductor element part 43 of the present embodiment are configured to function as a pressure sensor that generates an electric output (for example, pressure) according to a fluid pressure exerting onto the sensing portion 46. For the sake of simplification of illustration and explanation, bonding wires are not illustrated.

The primary molded part 5 is a synthetic resin part partly covering the electric circuit part 4, and is formed by molding a synthetic resin, such as polyphenylene sulfide, using a mold. In the present embodiment, specifically, the primary molded part 5 covers the most part of the electric circuit part 4 excluding the distal end portion 45 of the semiconductor element part 43 and a peripheral portion thereof.

Figure 2:
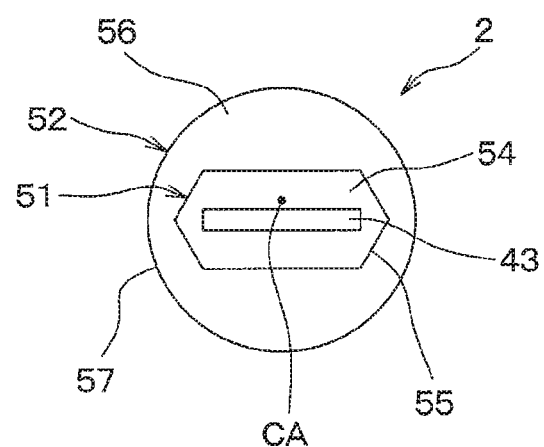
FIG. 2 is a diagram illustrating a front view of a primary molded article shown in FIG. 1.

The primary molded part 5 includes an element covering portion 51 and a body portion 52. Referring to FIG. 1 and FIG. 2, the element covering portion 51 is a pillar part that projects from the body portion 52 in the distal direction. In the present embodiment, the element covering portion 51 has a generally hexagonal cylindrical shape. The body portion 52 is located on a side of the element covering portion 51 in the proximal direction, and is integrally connected to the element covering portion 51. In the present embodiment, specifically, the element covering portion 51 and the body portion 52 are integrally and seamlessly molded with each other.

The element covering portion 51 has a distal end surface 54 and a first side surface 55. The element covering portion 51 covers the proximal portion 44 of the semiconductor element part 43 such that the distal end portion 45 projects from the distal end surface 54 and is exposed in the distal direction.

The distal end surface 54 is a surface exposing in the distal direction. The "surface exposing in the distal direction" is a surface facing in the distal direction. Specifically, an outward direction normal to the "surface exposing in the distal direction" and the distal direction form an angle of equal to or greater than 0 degree and less than 90 degrees therebetween. In the present embodiment, the distal end surface 54 is provided as a tapered surface that separates from a central axis CA toward the proximal direction in the side view. In this case, the side view is defined when the distal end surface 54 is viewed in a direction perpendicular to both of the thickness direction of the semiconductor element part 43 and the central axis CA. The central axis CA is defined by a straight line that is parallel to the distal direction and passes through the element covering portion 51, and is typically a central axis of the primary molded part 5. In the present embodiment, the distal end surface 54 is a plane surface defining an angle θ1 of approximately 75 to 85 degrees as in FIG. 1. The angle θ1 can be defined as an angle that is formed, inside of the primary molded part 5, between the central axis CA and a line of intersection between the central axis CA and a plane that includes the central axis CA and is parallel with the thickness direction of the semiconductor element part 43. The first side surface 55 is a surface extending from the outer edge of the distal end surface 54 in the proximal direction. In the present embodiment, the first side surface 55 is formed into a hexagonal cylinder shape parallel with the central axis CA.

The body portion 52 has an intermediate surface 56 and a second side surface 57. The intermediate surface 56 is a surface exposing in the distal direction, and extends from the end of the first side surface 55 in a direction intersecting with the proximal direction. In the present embodiment, as shown in FIG. 2, the intermediate surface 56 is provided in an entire circumference around the central axis CA. The intermediate surface 56 is provided to be in contact with a mold for a secondary molding 60 (see FIG. 3C), which will be described later, during a secondary molding for forming the secondary molded part 3 on a periphery of the body portion 52 in a region adjacent to the proximal portion than the intermediate surface 56.

In the present embodiment, the intermediate surface 56 is a tapered surface that separates from the central axis CA toward the proximal direction. Specifically, the intermediate surface 56 is formed into a surface having a circular truncated cone shape defining an angle θ2 of approximately 45 to 70 degrees as in FIG. 1. The angle θ2 can be defined as an angle formed, inside of the primary molded part 5, between the central axis CA and a line of intersection between the intermediate surface 56 and the plane that includes the central axis CA and parallel with the thickness direction of the semiconductor element part 43. Namely, in the present embodiment, the distal end surface 54 and the intermediate surface 56 are provided so as to satisfy a relationship of θ2<θ1.

The second side surface 57 is a surface extending from the outer edge of the intermediate surface 56 in the proximal direction. In the present embodiment, the second side surface 57 is formed into a cylindrical surface parallel to the central axis CA.

(Production Method for Molded Article of Embodiment)

An outline of a production method for the secondary molded article 1 according to the present embodiment will be described with reference to FIGS. 3A to 3D. In the production method, the primary molded article 2, which has the semiconductor element part 43 and the primary molded part 5, is covered with a synthetic resin, thereby to produce the secondary molded article 1.

Figure 3A:
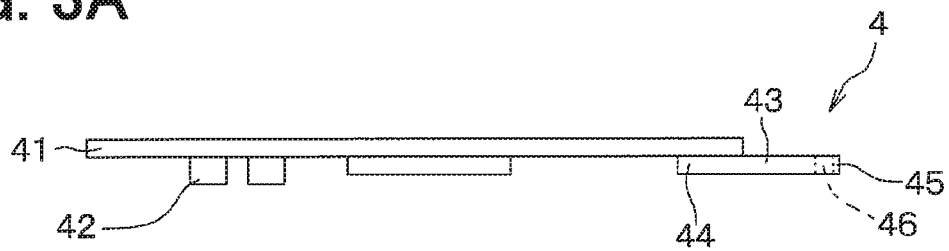
FIG. 3A is a schematic diagram illustrating a production method for the secondary molded article shown in FIG. 1.
Figure 3B:
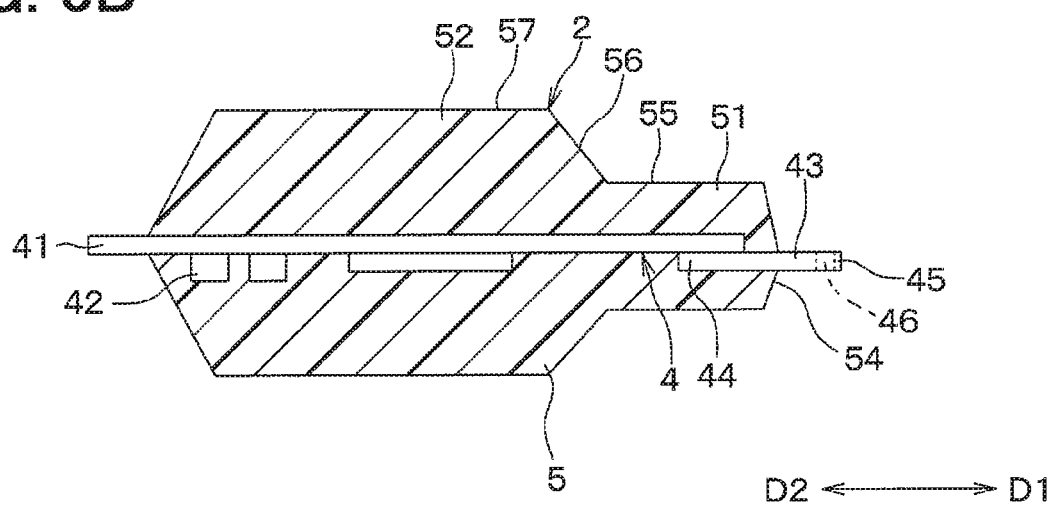
FIG. 3B is a schematic diagram illustrating the production method for the secondary molded article shown in FIG. 1.

Firstly, the electric circuit part 4 having the configuration described hereinabove is prepared (see FIG. 3A). Next, the electric circuit part 4 is fixed to a mold, which is not illustrated, and a die molding using a synthetic resin such as polyphenylene sulfide is performed to obtain the primary molded article 2 (see FIG. 3B). The prepared primary molded article 2, which has the configuration as described hereinabove, is set to a mold 60 for a secondary molding (see FIG. 3C and FIG. 3D).

Figure 3C:
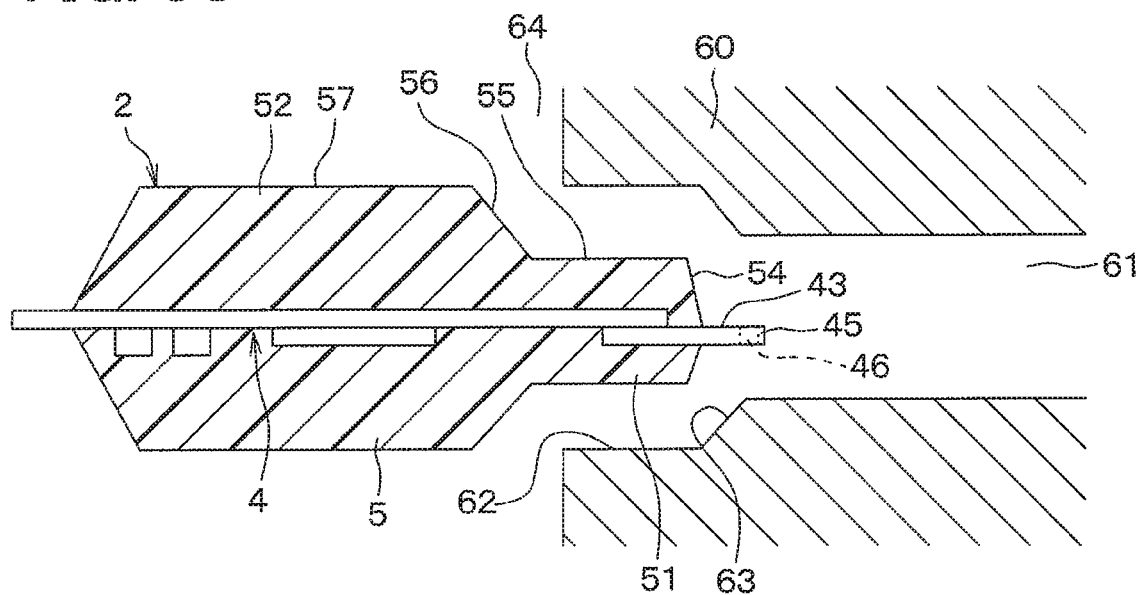
FIG. 3C is a schematic diagram illustrating the production method for the secondary molded article shown in FIG. 1.
Figure 3D:
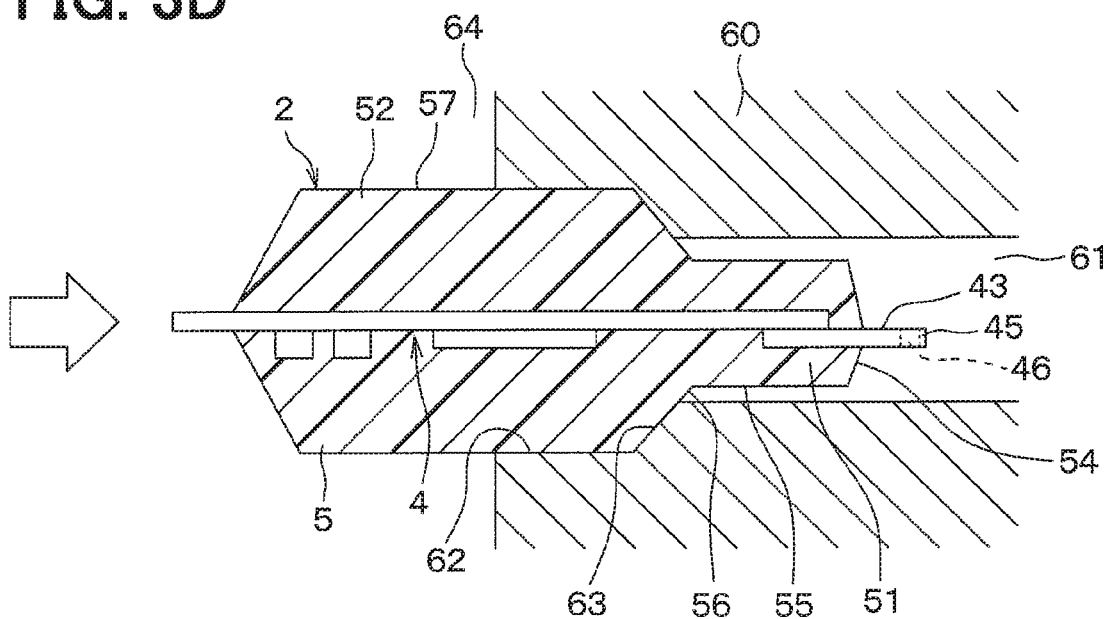
FIG. 3D is a schematic diagram illustrating the production method for the secondary molded article shown in FIG. 1.

A schematic configuration of the mold 60 for the secondary molding will be described. The mold 60 for the secondary molding is provided with an insertion hole 61 and a recess 62. The insertion hole 61 is a through hole provided so as to receive the element covering portion 51 and the semiconductor element part 43 of the primary molded article 2. Referring to FIG. 3C and FIG. 3D, when the primary molded article 2 is set to the mold 60 for the secondary molding, a predetermined gap exists between the first side surface 55 of the element covering portion 51 of the primary molded part 5 and the inner wall surface of the through hole 61 of the mold 60 for the secondary molding.

The recess 62 is provided so as to accommodate and support the body portion 52 of the primary molded article 2 when the primary molded article 2 is set to the mold 60 for the secondary molding. Namely, the recess 62 forms a molded article contact surface 63. The molded article contact surface 63 is provided to connect to an opening of the insertion hole 61. The molded article contact surface 63 is formed to be closely in contact with the intermediate surface 56 when the primary molded article 2 is set to the molded die 60 for the secondary molding. In the present embodiment, specifically, the molded article contact surface 63 has a shape of an inner surface of a circular truncated cone, corresponding to the intermediate surface 56. Referring to FIG. 3C and FIG. 3D, when the primary molded article 2 is set to the mold 60 for the secondary molding, the second side surface 57 of the body portion 52 of the primary molded part 5 and the inner wall surface of the recess 62 of the mold 60 facing the second side surface 57 are opposed to each other and closely in contact with each other with a predetermined fitting tolerance by clearance fitting.

As described above, the primary molded article 2 is set to the mold 60 for the secondary molding such that the intermediate surface 56 is in contact with the molded article contact surface 63 (see FIG. 3D). Thereafter, the die molding is performed by injecting a synthetic resin, such as polyphenylene sulfide, into a cavity 64 of the mold 60 for the secondary molding. Namely, the secondary molding is performed so as to cover the periphery of the region of the body portion 52 adjacent to the proximal portion than the intermediate surface 56 with the synthetic resin, inside of the mold 60 for the secondary molding. In this case, as shown by an arrow in FIG. 3D, the primary molded article 2 receives a molding pressure due to the injection of the synthetic resin. The intermediate surface 56 and the molded article contact surface 63 are brought into close contact with each other by the molding pressure. On the other hand, the element covering portion 51, which is adjacent to the distal end portion than the intermediate surface 56, is accommodated in the insertion hole 61 without being in contact with the inner wall surface of the mold 60 for the secondary molding. Therefore, the molding pressure is not exerted onto the element covering portion 51.

Effects of Embodiment

In the primary molded article 2 having the configuration as described hereinabove, the part of the semiconductor element part 43 (the part adjacent to the distal end portion 45) projects from the distal end surface 54 of the element covering portion 51 of the primary molded part 5 in such a manner that the distal end portion 45 exposes in the distal direction. In such a configuration, there may be a fear that the following defect will occur in the projected portion of the semiconductor element part 43 in the primary molded part 5. For example, if the distal end surface 54 of the element covering portion 51 receives the molding pressure during the secondary molding, cracks or interfacial peeling would occur in the vicinity of the semiconductor element part 43. Probably, if the semiconductor element part 43 receives stress due to the molding pressure, operation characteristics of the semiconductor element part 43 (i.e., sensor characteristics) would unintentionally vary. If the distal end portion 45 of the semiconductor element part 43 exposed outside is hit against the mold when the primary molded article 2 is set to the mold for the secondary molding, the semiconductor element part 43 would be broken or would cause change in operation characteristics.

In the configuration of the present embodiment, the primary molded part 5 has the body portion 52 on the side of the element covering portion 51 in the proximal direction. The body portion 52 has the intermediate surface 56 exposing in the distal direction. The intermediate surface 56 extends from the end of the first side surface 55 in the direction intersecting with the proximal direction, the end of the first side surface 55 being adjacent to the proximal portion. Therefore, the intermediate surface 56 extends outwardly from the element covering portion 51. Namely, the body portion 52 of the primary molded part 5 is provided with a projection projecting outwardly in the region where the intermediate surface 56 is provided. The mold 60 for the secondary molding has the recess 62 to correspond to the projection of the body portion 52 of the primary molded part 5. Further, the mold 60 for the secondary molding is formed with the insertion hole 61 that is in communication with the recess 62 and receives the element covering portion 51 and the semiconductor element part 43 therein.

An occurrence of defects in the region where the semiconductor element part 43 projects in the primary molded part 5 can be suppressed as much as possible by using the above-described configuration of the primary molded part 5 and the configuration of the mold for the above-described configuration of the primary molded part 5. Specifically, the intermediate surface 56 is, for example, provided as a mold contact surface during the secondary molding. Therefore, it is less likely that the element covering portion 51 will receive the molding pressure due to the distal end surface 54 being in contact with the mold 60 for the secondary molding. As such, the occurrence of various defects as described above due to the distal end surface 54 being in contact with the mold 60 for the secondary molding can be favorably avoided. When the primary molded article 2 is set to the mold 60 for the secondary molding, a predetermined gap exists between the first side surface 55 of the element covering portion 51 of the primary molded part 5 and the inner wall surface of the insertion hole 61 of the mold 60 for the secondary molding. Therefore, the workability in inserting the distal end portion 45 of the semiconductor element part 43, which projects outside of the primary molded part 5, improves. As such, damage to the semiconductor element part 43 or the change in operation characteristics of the semiconductor element part 43, which are caused when the primary molded article 2 is set to the secondary molded die 60, can be favorably suppressed.

In the configuration of the present embodiment, the intermediate surface 56 is the tapered surface that separates from the central axis CA toward the proximal direction. That is, the angle (180−θ2) defined between the first side surface 55 and the intermediate surface 56 is greater than 90 degrees. In such a configuration, therefore, an occurrence of cracks at the connection between the element covering portion 51 and the body portion 52 (i.e., the end of the first side surface 55 adjacent to the proximal portion) can be favorably suppressed.

In the configuration of the present embodiment, the intermediate surface 56 is formed in the entire circumference around the central axis CA. Therefore, in the state where the primary molded particle 2 is set to the mold 60 for the secondary molding, the intermediate surface 56 and the molded article contact surface 63 are in contact with each other on the entire circumference about the central axis CA, and the closely contact state therebetween is formed in the entire circumference about the central axis CA. In such a configuration, therefore, an occurrence of molding burrs during the secondary molding can be favorably suppressed.

In the configuration of the present embodiment, the tapered angle θ1 of the distal end surface 54 is set to an angle that is less than 90 degrees, but close to 90 degrees. This angle enhances mold releasability in a primary molding. In contrast, as described hereinabove, the tapered angle θ2 of the intermediate surface 56 is set to be a relatively small angle in consideration with workability in setting the primary molded article 2 to the mold 60 for the secondary molding and suppression of occurrence of cracks at the connection between the element covering portion 51 and the body portion 52. Thus, the tapered angles θ1 and θ2 satisfy the relationship of θ2<θ1. In this configuration, the workability in the secondary molding and the quality assurance of the secondary molded article 1 can be favorably achieved.

In the production method of the present embodiment, the primary molding article 2 is set to the mold 60 for the secondary molding in such a manner that the intermediate surface 56 is in contact with the article contact surface 63 of the mold 60 for the secondary molding. As such, the occurrence of defects at the region where the semiconductor element part 43 projects in the primary molded part 5 can be suppressed as much as possible.

Modifications

The present disclosure is not limited to the embodiment described hereinabove, but modified from the embodiment in various ways. Hereinafter, typical modification will be described. In the following descriptions of the modifications, only portions different from the above-described embodiment will be described. Therefore, in the following descriptions of the modifications, configuration elements having the reference numerals same as the above-described embodiment can be suitably referred to the descriptions of the above-described embodiment, as long as those have no technical discrepancy.

The configuration of the present disclosure is not limited to the above-described embodiment. For example, the primary molded article 2 may be a secondary molded article that is obtained by performing secondary molding using mold with a synthetic resin such as polyphenylene sulfide relative to a primary molded article that is a synthetic resin molded part. That is, in this description, the term "primary molded article" is merely used to express a relation relative to the "secondary molded article".

Figure 4:
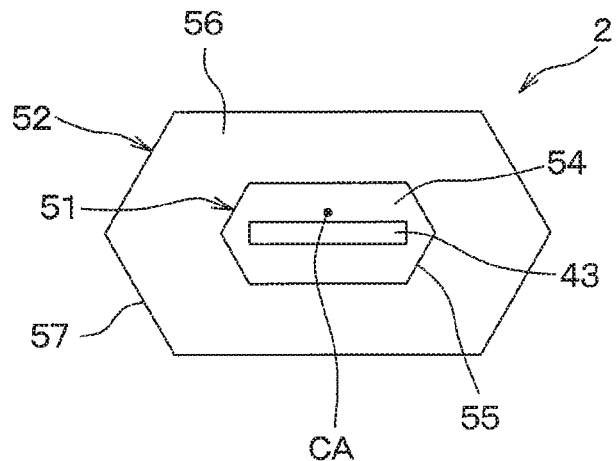
FIG. 4 is a diagram illustrating a front view of a modification of a primary molded article shown in FIG. 2.

The shape of the primary molded part 5 is not limited to the one indicated in the above-described embodiment. As shown in FIG. 4, for example, the body portion 52 may be formed into a polygonal columnar shape. Further, the element covering portion 51 may be formed into a circular column shape.

Each of the distal end surface 54 and the intermediate surface 56 is not limited to the tapered surface. Namely, the distal end surface 54 and/or the intermediate surface 56 may be a surface orthogonal to the central axis CA.

The first side surface 55 and/or the second side surface 57 may be a surface not parallel with the central axis CA. Namely, the element covering portion 51 may be formed into a truncated multi-angular pyramid shape or a truncated circular cone shape. Likewise, the body portion 52 excluding the region of the intermediate surface 56 may be formed into a truncated multi-angular pyramid shape or a truncated circular cone shape.

Figure 5:
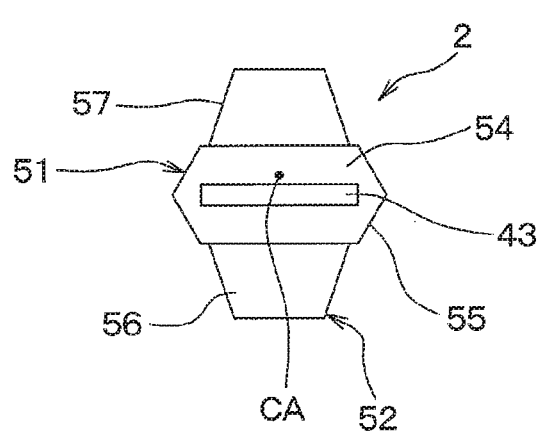
FIG. 5 is a diagram illustrating a front view of a modification of a primary molded article shown in FIG. 2.

As shown in FIG. 5, the intermediate surface 56 may be provided at a part of the entire circumference around the central axis CA.

Figure 6:
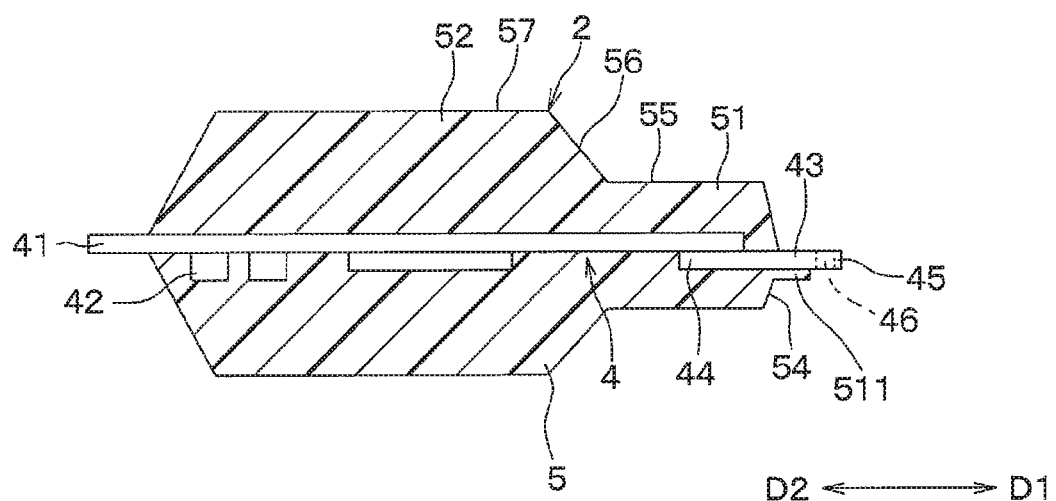
FIG. 6 is a diagram illustrating a side view of a modification of a primary molded article shown in FIG. 1.
Figure 7:
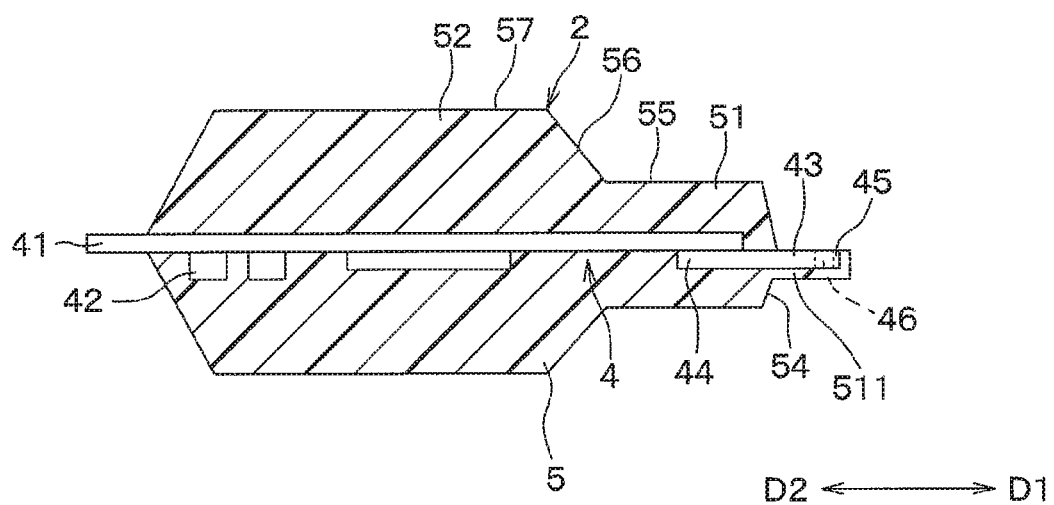
FIG. 7 is a diagram illustrating a side sectional view for showing a schematic configuration of a primary molded article for a production method according to a modification.

As shown in FIG. 6, the primary molded part 5 may be provided with an extended portion 511 extending from the distal end surface 54 along the semiconductor element part 43 in the distal direction. In this case, the extended portion 511 is ended at a position without reaching the distal end portion 45 so as to expose the distal end portion 45 of the semiconductor element part 43 in the distal direction.

The configuration of the present disclosure is not limited to the pressure sensor. However, there may be a case suitable to widely expose the sensing portion 46 in a sensing space. Further, there may be a case where the distal end portion 45 of the semiconductor element part 43 needs to be exposed in the distal direction for forming, for example, a diaphragm and a pressure reference chamber in the configuration of the sensing portion 46. The configuration of the present disclosure is typically suitably used for a pressure sensor.

The production method of the present disclosure is not limited to the one of the above-described embodiment. For example, the production method of the present disclosure can be also used for the primary molded article 2 in which the surface of the distal end portion 45 of the semiconductor element part 43 is covered with the extended portion 511. Namely, in the production method of the present disclosure, the element covering portion 51 is at least provided so as to allow the distal end portion 45 to project from the distal end surface 54 while covering the proximal portion 44 of the semiconductor element part 43.

Referring to FIGS. 3C and 3D, when the primary molded article 2 is set to the mold 60 for the secondary molding, there may be a predetermined gap between the second side surface 57 of the body portion 52 of the primary mold part 5 and the portion of the inner wall surface of the recess 62 of the mold 60 for the secondary molding, which faces the second side surface 57. In this case, the first side surface 55 of the element covering portion 51 of the primary molded part 5 and the inner wall surface of the insertion hole 61 of the mold 60 for the secondary molding may be formed to be in contact with each other with a predetermined fitting tolerance by clearance fitting.

The plural configuration elements, which are integrally and seamlessly formed in the above description, may be formed by bonding separate members with each other. Likewise, the plural configuration elements, which are formed by bonding separate members with each other, may be integrally and seamlessly formed with each other.

In the above description, the plural configuration elements that are made of the same material may be formed by different materials. Likewise, the plural configuration elements that are made by different materials may be formed by the same material.

The modifications are not limited to the examples described hereinabove. The plural modifications may be combined with each other. Further, all of or a part of the above-described embodiment and all of or a part of the modifications may be combined one another.

The invention claimed is:

1. A synthetic resin molded article comprising: an electric element part that is a semiconductor substrate extending in a distal direction (DI) from a proximal portion to a distal end portion; and
a primary molded part that is a synthetic resin part partly covering the electric element part, the primary molded part includes
an element covering portion that has a distal end surface and a first side surface, and is configured to cover the proximal portion of the electric element part and to expose the distal end portion of the electric element part from the distal end surface such that the distal end portion exposes in the distal direction, the distal end surface exposing in the distal direction, the first side surface extending from an outer edge of the distal end surface in a proximal direction opposite to the distal direction, and
a body portion that has an intermediate surface and a second side surface, and is integrally connected to the element covering portion on a side of the element covering portion in the proximal direction, the intermediate surface exposing in the distal direction and extending in a direction intersecting with the proximal direction from an end of the first side surface, the end of the first side surface being adjacent to the proximal portion than the distal end portion, the second side surface extending from an outer edge of the intermediate surface in the proximal direction; wherein the intermediate surface is a tapered surface that separates from a central axis (CA) toward the proximal direction, the central axis being parallel with the distal direction and passing through the element covering portion.

2. The synthetic resin molded article according to claim 1, wherein
the intermediate surface is provided on an entire circumference around a central axis that is parallel with the distal direction and passes through the element covering portion.

3. The synthetic resin molded article according to claim 1, wherein
an angle defined, inside of the primary molded part, between a central axis passing through the element covering portion and a line of intersection between the distal end surface and a plane that is parallel with the distal direction and includes the central axis is referred to as $\theta_1$,
an angle defined, inside of the primary molded part, between the central axis and a line of intersection between the intermediate surface and the plane that is parallel with the distal direction and includes the central axis is referred to as $\theta_2$, and
the distal end surface and the intermediate surface are provided so as to satisfy a relationship of $\theta_2 < \theta_1$.

4. The synthetic resin molded article according to claim 1, further comprising:
   a secondary molded part that covers a periphery of a region of the body portion, the region being further from the intermediate surface in the proximal direction.

5. The synthetic resin molded article according to claim 4, wherein
   the intermediate surface is configured to be in contact with a mold for secondary molding that is used in a secondary molding for molding the secondary molded part.

* * * * *